(12) United States Patent
Sato

(10) Patent No.: US 10,192,941 B2
(45) Date of Patent: Jan. 29, 2019

(54) DISPLAY DEVICE

(71) Applicant: Japan Display Inc., Tokyo (JP)

(72) Inventor: Toshihiro Sato, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/361,547

(22) Filed: Nov. 28, 2016

(65) Prior Publication Data

US 2017/0170248 A1 Jun. 15, 2017

(30) Foreign Application Priority Data

Dec. 14, 2015 (JP) .................................. 2015-243151

(51) Int. Cl.
| | | |
|---|---|---|
| *H01L 27/32* | (2006.01) | |
| *H01L 51/52* | (2006.01) | |
| *G09G 3/3266* | (2016.01) | |

(52) U.S. Cl.
CPC ....... *H01L 27/3258* (2013.01); *G09G 3/3266* (2013.01); *H01L 27/322* (2013.01); *H01L 27/3262* (2013.01); *H01L 27/3276* (2013.01); *G09G 2300/0809* (2013.01); *G09G 2310/0202* (2013.01); *G09G 2380/02* (2013.01); *H01L 27/3265* (2013.01); *H01L 51/52* (2013.01); *H01L 2251/5338* (2013.01)

(58) Field of Classification Search
None
See application file for complete search history.

(56) References Cited

U.S. PATENT DOCUMENTS

| | | | | |
|---|---|---|---|---|
| 9,543,369 | B2 * | 1/2017 | Lee | ..................... H01L 27/3272 |
| 2015/0091005 | A1 | 4/2015 | Park | |
| 2016/0276421 | A1 * | 9/2016 | Lee | ..................... H01L 27/3272 |

FOREIGN PATENT DOCUMENTS

| | | | |
|---|---|---|---|
| JP | 2005-079472 A | | 3/2005 |
| JP | 2007-288078 A | | 11/2007 |
| JP | 2007288078 A | * | 11/2007 |
| JP | 2014-199322 A | | 10/2014 |
| KR | 10-2011-0135045 A | | 12/2011 |
| KR | 10-2015-0037159 A | | 4/2015 |

OTHER PUBLICATIONS

Korean Office Action dated Jun. 14, 2018 for corresponding Korean Patent Application No. 10-2016-0148131, with partial translation.

* cited by examiner

*Primary Examiner* — Telly Green
(74) *Attorney, Agent, or Firm* — Typha IP LLC

(57) ABSTRACT

The display device includes a first substrate having flexibility and including pixels arranged in matrix form in a first direction and a second direction, the first direction and second direction mutually intersecting each other, a transistor layer arranged above the first substrate and including at least one transistor arranged in each of the pixels, an inorganic insulation film formed continuously across the pixels in the second direction, and a plurality of aperture parts extending in the second direction and arranged between two transistors arranged in two of the plurality of pixels adjacent in the first direction, a plurality of first groups of wiring extending in the first direction and connected to each of the pixels arranged in the first direction, and a plurality of second groups of wiring extending in the second direction and connected to each of the pixels arranged in the second direction.

20 Claims, 16 Drawing Sheets

DISPLAY DEVICE

CROSS REFERENCE TO RELATED APPLICATIONS

This application is based upon and claims the benefit of priority from the prior Japanese Patent Application No. 2015-243151, filed on Dec. 14, 2015, the entire contents of which are incorporated herein by reference.

FIELD

The present invention is related to a display device. In particular, the present invention is related to a structure of wiring in a display device.

BACKGROUND

An organic electroluminescence (referred to herein as organic EL) display device is arranged with a light-emission element 128 in each pixel and displays an image by individually controlling the emitted light. A light emission-element 128 includes a structure in which a layer (referred to herein as [light-emission layer]) including an organic EL material is sandwiched between a pair of electrodes distinguished as an anode and cathode. When electrons are injected from the cathode and holes are injected from the anode, the electrons and holes recombine in the light-emission layer. In this way, light emitting molecular within the light emission layer are excited by an excess of discharged energy and then de-excited and thereby light is emitted.

In the organic EL display device, the anode in each light-emission element 128 is arranged as a pixel electrode in each pixel and the cathode is arranged as a common electrode which bridges a plurality of pixels and is applied with a common voltage. The organic EL display device controls the light emitted by a pixel by applying the voltage of the pixel electrode to each pixel with respect to the voltage of the common electrode.

In recent years, flexible display devices are being actively developed which have display regions which can be bent. There is a problem whereby when a display device is bent, stress is concentrated in wiring formed in a display region of a flexible display device making the wiring easy to break. In addition, when a display device is bent, cracks easily occur in a gate insulation layer included in a transistor or inorganic insulation layers such as an interlayer insulation layer covering a transistor which easily leads to reliability defects.

In order to solve such problems, for example in Japanese Laid Open Patent Publication 2005-079472, a wiring substrate arranged with wiring having a meandering section and comprised from a conductive film is arranged above a substrate is disclosed. Here, a meandering section may be any one of a curved line shape, a bent line shape, a V character shape, a U character shape, an S character shape or a semi-circular shape. A meandering section may meander two-dimensionally keeping the same distance with respect to a reference surface which is parallel to a substrate surface or may meander three-dimensionally while the distance changes with respect to a reference surface which is parallel to a substrate surface.

A technique for relieving internal stress and concentrated stress by separating an insulation film stacked film body into island shapes in order to relieve the generation of cracks when transferring during the manufacturing process or relieving internal stress when a display device is bent is disclosed in Japanese Laid Open Patent Publication 2007-288078.

SUMMARY

One aspect of a display device according to the present invention is a display device including a first substrate having flexibility and including a plurality of pixels arranged in a matrix form in a first direction and a second direction, the first direction and second direction mutually intersecting each other, a transistor layer arranged above the first substrate and including at least one transistor arranged in each of the plurality of pixels, an inorganic insulation film formed continuously across the plurality of pixels in the second direction, and a plurality of aperture parts passing through the inorganic insulation film and extending in the second direction and arranged between two transistors arranged in two of the plurality of pixels adjacent in the first direction, a plurality of first groups of wiring extending in the first direction having periodic reliefs in a thickness direction of the first substrate and connected to each of a plurality of pixels arranged in the first direction among the plurality of pixels, and a plurality of second groups of wiring extending in the second direction and connected to each of a plurality of pixels arranged in the second direction among the plurality of pixels.

DESCRIPTION OF EMBODIMENTS

In the structure of Japanese Laid Open Patent Publication 2005-079472, stress breakage in a gate insulation layer included in a transistor or inorganic insulation layer such as an interlayer insulation layer covering a transistor is not considered. In the structure of Japanese Laid Open Patent Publication 2007-288078, consideration is not given to an island pattern of an insulation film stacked layer body and bending direction of a display device.

One aim of the present invention is to provide a display device with high reliability in which cracks in an inorganic insulation layer or wiring breakage rarely occur when the display device is bent.

The embodiments of the present invention are explained below while referring to the diagrams. However, it is possible to perform the present invention using various different forms and the present invention should not be limited to the content described in the embodiments exemplified herein. In addition, although the width, thickness and shape of each component are shown schematically compared to their actual form in order to better clarify explanation, the drawings are merely an example and should not limit an interpretation of the present invention. In addition, in the specification and each drawing, the same reference symbols are attached to similar elements and elements that have been mentioned in previous drawings, and therefore a detailed explanation may be omitted where appropriate.

First Embodiment

[Structure]

Figure 1:
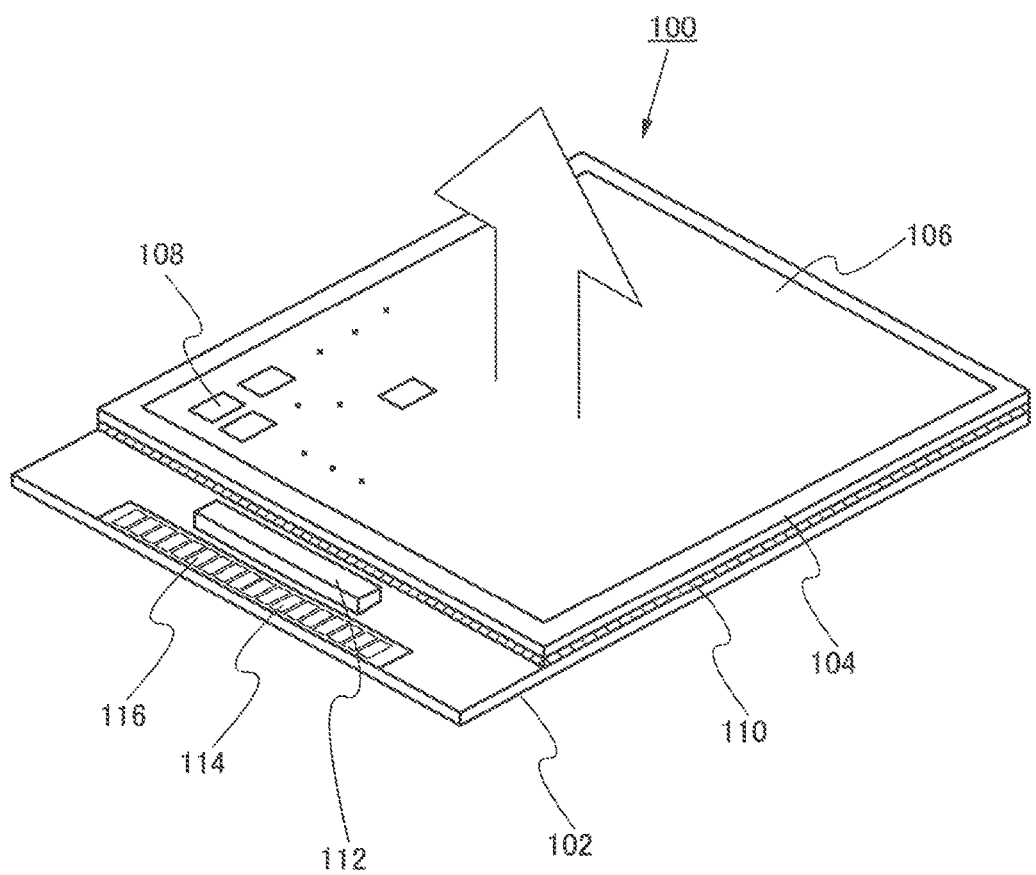
FIG. 1 is a perspective view diagram for explaining a structure of a display device related to one embodiment of the present invention.

The structure of a display device 100 related to the present embodiment is explained while referring to FIG. 1. FIG. 1 is a perspective view diagram showing the structure of a display device 100 related to the present embodiment. The display device 100 related to the present embodiment includes a first substrate 102, a second substrate 104, a plurality of pixels 108, a sealing member 110, a terminal region 114 and a connection terminal 116.

A display region 106 is arranged in the first substrate 102. The display region 106 is formed by arranging the plurality of pixels 108. The second substrate 104 is arranged as a sealing member 110 on the upper surface of the display region 106. The second substrate 104 is fixed to the first substrate 102 by the sealing member 110 which encloses the display region 106. The display region 106 formed in the first substrate 102 is sealed by the second substrate 104 which is a sealing member and the sealing member 110 so as not to be exposed to the air. With such a sealing structure, degradation of a light emission element 128 arranged in a pixel 108 is suppressed.

The terminal region 114 is arranged at one end part of the first substrate 102. The terminal region 114 is arranged on the outer side of the second substrate 104. The terminal region 114 is formed by a plurality of connection terminals 116. A wiring substrate for connecting devices which output a video signal or a power supply with a display panel is arranged in the connection terminal 116. A connection point of the connection terminal 116 connected with the wiring substrate is exposed to the exterior. A driver IC 112 which outputs a video signal input from the terminal region 114 to the display region 106 is arranged in the first substrate 102.

Figure 2:
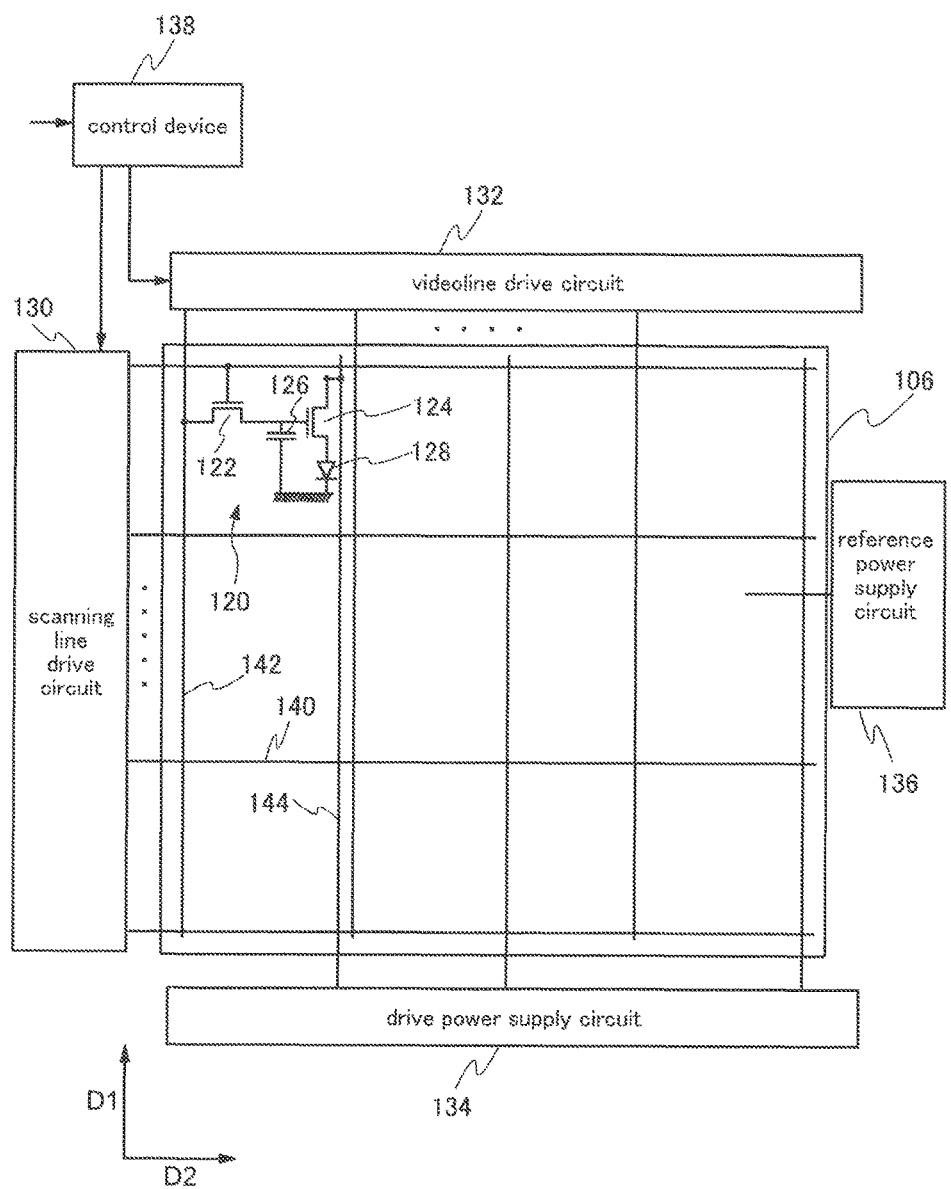
FIG. 2 is a circuit diagram for explaining a structure of a display device related to one embodiment of the present invention.

Next, a circuit structure of the display device 100 related to the present embodiment is explained while referring to FIG. 2. FIG. 2 is a diagram showing a circuit structure of the display device 100 related to the present embodiment.

The display device 100 is arranged with the display region 106 which displays an image, and a drive part which drives the display region 106. The plurality of pixels 108 are arranged in a matrix form in the display region 106 of the display device 100 and a pixel circuit 120 is included in each pixel 108. The pixel circuit 120 includes at least a selection transistor 122, a drive transistor 124, a storage capacitor 126 and a light emission element 128.

On the other hand, the drive part includes a scanning line drive circuit 130, a video line drive circuit 132, a drive power supply circuit 134, a reference power supply circuit 136, and a control device 138. The drive part drives the pixel circuit 120 and includes a function such as controlling light emitted by the light emission element 128.

The scanning line drive circuit 130 is connected to a scanning signal line 140 arranged in each row of pixels 108 in a horizontal direction (pixel row). The scanning line drive circuit 130 selects a scanning signal line 140 in sequence according to a timing signal input from the control device 138 and applies a voltage to the selected scanning signal line 140 for turning ON the selection transistor 122.

The video line drive circuit 132 is connected to a video signal line 142 arranged in each column of pixels 108 in a perpendicular horizontal direction (pixel column). The video line drive circuit 132 is input with a video signal from the control device 138 and outputs a voltage to each video signal line 142 according to a video signal of a selected pixel row in alignment with a selection of a scanning signal line 140 by the scanning line drive circuit 130. This voltage is written to the storage capacitor 126 via the selection transistor 122 at the selected pixel row. The drive transistor 124 supplies a current to the light emission element 128 according to the written voltage and thereby a light emission element 128 of a pixel 108 corresponding to the selected scanning signal line 140 emits light.

The drive power supply circuit 134 is connected to a power supply voltage line 144 arranged in each pixel column and supplies a current to a light emission element 128 via the power supply voltage line 144 and a drive transistor 124 on a selected pixel row.

The reference power supply circuit 136 is connected to a reference power supply line 146 and supplies a fixed voltage to a common electrode which forms a cathode electrode of the light emission element 128. The fixed voltage can be set to a ground voltage for example.

In the present embodiment, one electrode of the light-emission element 128 is a pixel electrode formed in each pixel 108 and the other electrode of the light-emission element 128 is a common electrode arranged covering and in common with a plurality of pixels 108. A pixel electrode is connected to a drive transistor 124. On the other hand, a common electrode is formed by an electrode across a plurality of pixels 108.

Figure 3A:
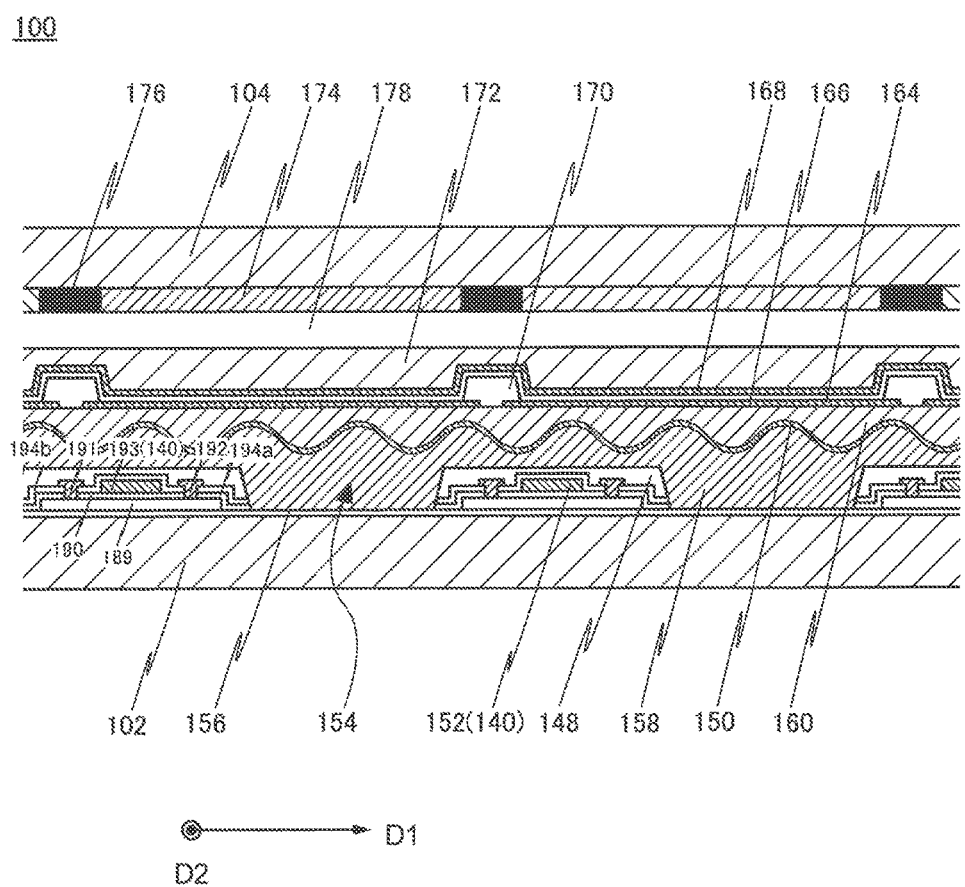
FIG. 3A is a cross-sectional diagram for explaining a structure of a display device related to one embodiment of the present invention.
Figure 3B:
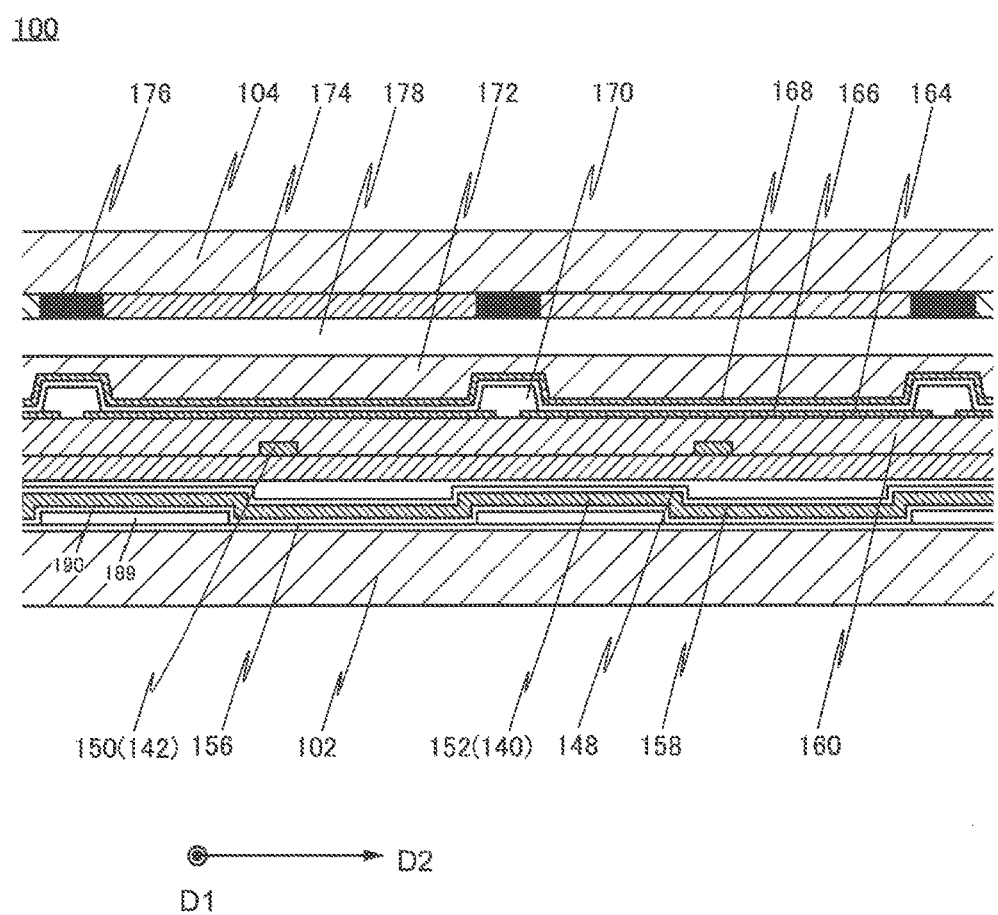
FIG. 3B is a cross-sectional diagram for explaining a structure of a display device related to one embodiment of the present invention.

The structure of the display device 100 related to the present embodiment is explained in detail while referring to FIG. 3A and FIG. 3B.

FIG. 3A and FIG. 3B are cross-sectional diagrams showing the structure of the display device 100 related to the present embodiment, FIG. 3A shows a cross-sectional structure perpendicular to a direction D2 and FIG. 3B shows a cross-sectional structure perpendicular to a direction D1.

The display device 100 related to the present embodiment is arranged with at least the first substrate 102, transistor layer 148, a plurality of first groups of wiring 150, and a plurality of second groups of wiring 152.

The first substrate 102 has flexibility and an organic resin can be used as the material of the first substrate 102 having flexibility. Polyimide can be used for example as the organic resin.

A plurality of pixels 108 are further arranged on a surface of the first substrate 102 in a matrix form in a first direction D1 and second direction D2 which mutually intersect each other. The first direction D1 and second direction D2 may also be mutually orthogonal. In the embodiments below, the first direction D1 and second direction D2 are shown as being mutually orthogonal.

The transistor layer 148 is arranged above the first substrate 102. At least one transistor is arranged for each of the plurality of pixels 108 in the transistor layer 148. For example, a selection transistor 122 and drive transistor 124 and the like are arranged in each of the plurality of pixels 108. In FIG. 3A and FIG. 3B, the transistor arranged in the transistor layer 148 is a selection transistor 122. Here, the transistor layer 148 means a layer including each type of transistor and the interlayer insulation layer 194 which covers the transistors. Each type of transistor includes at least a semiconductor layer 189, gate insulation layer 190, source electrode 191, drain electrode 192 and gate electrode 193. Although a top gate structure in which the gate electrode 193 of transistor is arranged above the semiconductor layer 189 is shown in the diagrams, the present invention is not limited to this structure, a bottom gate structure for example is also possible in which the gate electrode 193 is arranged below the semiconductor layer 189.

The transistor layer 148 includes an aperture part 154. The aperture part 154 sections two transistors adjacent in the first direction D1. Since the aperture part 154 sections adjacent transistors, the aperture part 154 may pass through the transistor layer 148. In this example, the transistor layer 148 is open as far as a gate insulation layer common to each transistor. However, the present invention is not limited to this structure and the aperture part 154 does not have to pass through all the layers of the transistor layer 148. For example, the transistor layer 148 may be open as far as an interlayer insulation layer but not pass through a gate insulation layer. The aperture part 154 extends in the second direction D2 which intersects the first direction D1 in the surface of the first substrate 102. The aperture part 154 can be easily formed using a photolithography method. In other words, the transistor layer 148 is arranged with a plurality of regions which include one or more transistors and the interlayer insulation layer 194 in the display region 106 in a separated form. That is, it is possible to view the transistor 148 as including a plurality of regions including one or more transistors and the interlayer insulation layer 194, and a part or the entire interlayer insulation layer 194 between this plurality of regions is removed.

By adopting such a structure, cracks in an inorganic layer and resulting wire breakage hardly occurs. In particular, in the case where a bending direction is stipulated to be perpendicular to the direction D1 (in other words, in the case where a bent line is stipulated to be parallel to the direction D2), it is possible to more effectively prevent cracks in an inorganic layer and resulting wire breakage. Therefore, it is possible to provide a display device 100 with improved reliability.

The display device 100 related to the present embodiment may be further arranged with an underlying layer 156 arranged between the first substrate 102 and transistor layer 148. It is possible to use an inorganic insulation layer as the material of the underlying layer 156. It is possible to use a film of silicon oxide (SiOx), silicon nitride (SiNx), silicon nitrided oxide (SiOxNy), silicon oxynitride (SiNxOy), aluminum oxide (AlOx), aluminum nitride (AlNx), aluminum nitrided oxide (AlOxNy), and aluminum oxynitride (AlNxOy) and the like (x and y are arbitrary) as the material of the inorganic insulation layer. In addition, a structure in which these films are stacked may also be used.

By adopting such a structure, it is possible to suppress the infiltration of moisture to the interior of the display device 100 from the side of the first substrate 102. Therefore, it is possible to provide a display device 100 with improved reliability.

A concave-convex layer 158 may be further arranged below the plurality of first groups of wiring 150 and covering the transistor layer 148. The surface of the concave-convex layer 158 has a concave-convex shape.

It is possible to use an organic resin as the material of the concave-convex layer 158. For example, it is possible to use an acrylic resin as the organic resin. The concave-convex shape of the surface of the concave-convex layer 158 can be formed using a photolithography method. Here, if a photolithography method using a halftone mask is used, the concave-convex shape of the surface can be formed with continuous reliefs.

By adopting such a structure, it is possible to relieve the stress applied to the first group of wiring 150 arranged thereupon and wire breakage hardly occurs. Therefore, it is possible to provide a display device 100 with improved reliability.

The first group of wiring 150 extends in the direction D1, and is connected to each of the plurality of pixels 108 arranged in the direction D1 within the plurality of pixels 108 (not shown in the diagrams). In this example, the first group of wiring 150 is arranged above the concave-convex layer 158 arranged above the transistor layer 148.

Furthermore, the first group of wiring 150 includes reliefs in a thickness direction of the first substrate 102. A relief is caused by the concave-convex shape of the surface of the concave-convex layer 158 arranged below the first group of wiring 150. A relief may have periodicity.

A second group of wiring 152 extends in the second direction D2 which intersects the direction D1 and is connected to each of the plurality of pixels 108 arranged in the direction D2 within the plurality of pixels 108.

By adopting such a structure, cracks in an inorganic layer or wire breakage hardly occurs when bending along a direction perpendicular to the first direction D1. Therefore, it is possible to provide a display device 100 with improved reliability.

The first group of wiring 150 may include a video signal line 142 and power supply voltage line 144. At this time, the second group of wiring 152 may include a scanning signal line 140. That is, the first direction D1 at this time indicates a direction in which the video signal line 142 extends, and the second direction D2 indicates a direction in which the scanning signal line 140 extends.

FIG. 3A and FIG. 3B show a video signal line 142 as a wiring included in the first group of wiring 150, and a scanning signal line 140 as a wiring included in the second group of wiring 152. In addition, a form in which a scanning signal line also serves as a gate electrode 193 of the selection transistor 122 is shown in these diagrams.

By adopting such a structure, cracks in an inorganic layer or wire breakage hardly occurs when bending along a direction perpendicular to the video signal line 142. Referring to FIG. 2, the video signal line 142 is a wave shaped wiring extending in the first direction D1 as in FIG. 3A, and since the video signal line 142 is a wiring extending in a vertical direction, wire breakage hardly occurs when the display device 100 is bent as if to be separated vertically. Therefore, it is possible to provide a display device 100 with improved reliability. Furthermore, as in FIG. 3B, the transistor layer 148 is formed so as not to be continuously divided in the second direction D2 in the display region 106. Specifically, the gate insulation layer 190, interlayer insulation layer 194 and second group of wiring 152 are formed continuously. Therefore, it is possible to arrange wiring or transistors at a high density to a certain extent in the transistor layer 148. Furthermore, a relief of the first group of wiring 150 in the thickness direction of a substrate extending in the first direction D1 is larger than a relief of the second group of wiring 152 in the thickness direction of a substrate extending in the second direction D2. The second group of wiring 152 also has a number of reliefs due to the effects of an underlying layer. However, they are smaller than the reliefs of the first group of wiring 150 in which the reliefs are actively arranged.

A planarizing insulation layer 160 is arranged above the first group of wiring 150. The planarizing insulation layer 160 is arranged in order to flatten a concave-convex shape caused by a transistor or the reliefs of the first group of wiring 150. It is possible to use an organic resin as a material of the planarizing insulation layer 160. It is possible to use an acrylic resin for example as the organic resin.

In other words, the planarizing insulation layer 160 and concave-convex layer 158 sandwich the first group of wiring 150. In this way, it is possible to further relieve stress applied to the first group of wiring 150 and wire breakage hardly occurs.

A light-emission element 128 is arranged above the planarizing insulation layer 160. The light-emission element 128 has a layer structure including the pixel electrode 164, light emission layer 166 and common electrode 168 in this order from a bottom layer. The pixel electrode 164 is arranged in each of the plurality of pixels 108 and the common electrode 168 is arranged in common across the plurality of pixels 108. A bank 170 is arranged so as to cover an end part of each common electrode 168 and sections adjacent light-emission elements 128.

A sealing layer 172 is arranged across the display region 106 above the light-emission element 128. Since the sealing layer 172 suppresses the infiltration of moisture to the light-emission layer 166, it is preferred to be a layer including an inorganic resin layer.

The second substrate 104 is bonded opposing the first substrate 102 via a sealing member (not shown in the diagram) so as to sandwich the transistor layer 148 and light emission element 128. In this example, a color filter 174 is arranged corresponding to the position of each of the plurality of pixels 108 in the surface of the second substrate 104 on the first substrate 102 side. Furthermore, a light blocking layer 176 is arranged for suppressing mixed colors due to light emitted by a pair of adjacent pixels 108. A filler 178 is filled between the first substrate 102 and second substrate 104. Here, although an example is explained wherein each light-emission element 128 emits white light and color filters 174 are combined to display color corresponding to each pixel, in the case where each adjacent light-emission element 128 uses a structure in which light is emitted in a different color such as red, green or blue for example, the display device 100 may also be configured without arranging any one of or all of the color filter 174, light blocking layer 176, filler 178 or second substrate 104.

The structure of the display device 100 related to the present embodiment was explained above. According to the present embodiment, cracks in an inorganic layer or wire breakage hardly occurs when the display device 100 is bent. Therefore, it is possible to provide the display device 100 with improved reliability.

Second Embodiment

Figure 4:
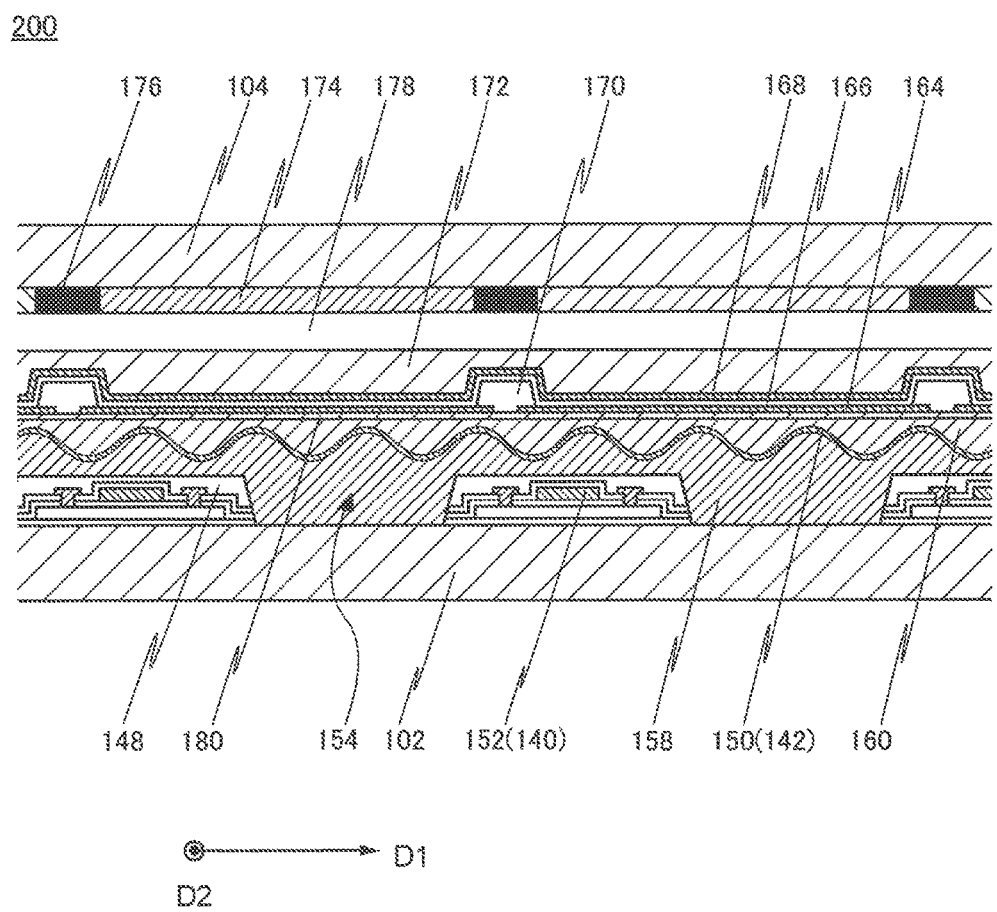
FIG. 4 is a cross-sectional diagram for explaining a structure of a display device related to one embodiment of the present invention.

The structure of a display device 200 related to the present embodiment is explained in detail while referring to FIG. 4. FIG. 4 is a cross-sectional diagram showing a structure of a display device 200 related to the present embodiment.

When the display device 200 related to the present embodiment is compared with the display device 100 related to the first embodiment, the display device 200 related to the present embodiment is different in that an aperture part of the transistor layer 148 also passes through the underlying layer 156.

By adopting such a structure, since it is possible to secure a large height difference in reliefs of the first group of wiring 150, and cracks in an inorganic insulation layer or wire breakage occur even less. Therefore, it is possible to provide a display device 200 with even more improved reliability.

Furthermore, an inorganic insulation layer 180 may be arranged above the planarizing insulation layer 160. It is possible to use a film of silicon oxide (SiOx), silicon nitride (SiNx), silicon nitrided oxide (SiOxNy), silicon oxynitride (SiNxOy), aluminum oxide (AlOx), aluminum nitride (AlNx), aluminum nitrided oxide (AlOxNy), and aluminum oxynitride (AlNxOy) and the like (x and y are arbitrary) as the material of the inorganic insulation layer 180. In addition, a structure in which these films are stacked may also be used.

By adopting this type of structure, it is possible to suppress the infiltration of moisture from the first substrate 102 side which is feared due to opening of the underlying layer 156. Therefore, it is possible to provide a display device 200 with improved reliability.

Third Embodiment

Figure 5:
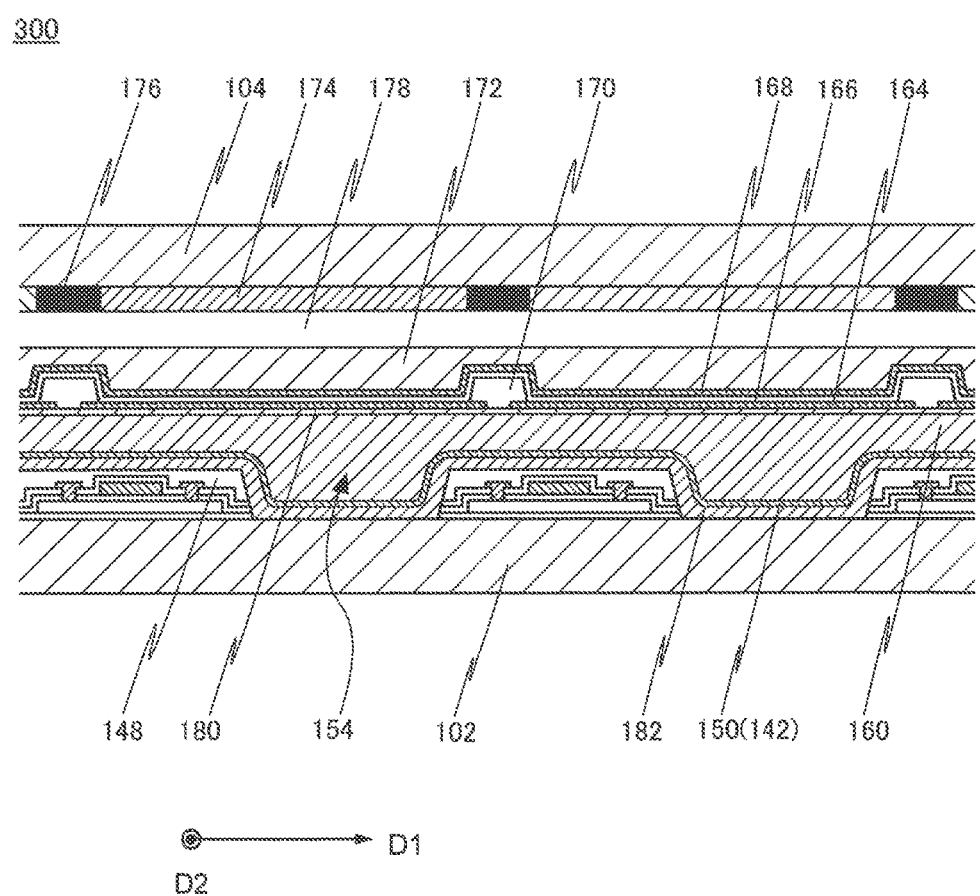
FIG. 5 is a cross-sectional diagram for explaining a structure of a display device related to one embodiment of the present invention.

The structure of a display device 300 related to the present embodiment is explained in detail while referring to FIG. 5. FIG. 5 is a cross-sectional diagram showing a structure of a display device 300 related to the present embodiment.

When the display device 300 related to the present embodiment is compared with the display device 200 related to the second embodiment, the display device 300 related to the present embodiment is different in that an organic insulation layer 182 is included covering the transistor layer 148. A plurality of first groups of the wiring 150 is arranged along a surface of the transistor layer 148 including a plurality of aperture parts 154 above the organic insulation layer 182. That is, a plurality of first groups of the wiring 150 is arranged along a peak part, side wall and bottom surface of the transistor layer 148.

By adopting such a structure, it is possible to form the reliefs of the first group of wiring 150 using the concave-convex shape of the transistor layer 148. Therefore, it is possible to simplify the manufacturing process and reduce manufacturing costs.

Fourth Embodiment

Figure 6:
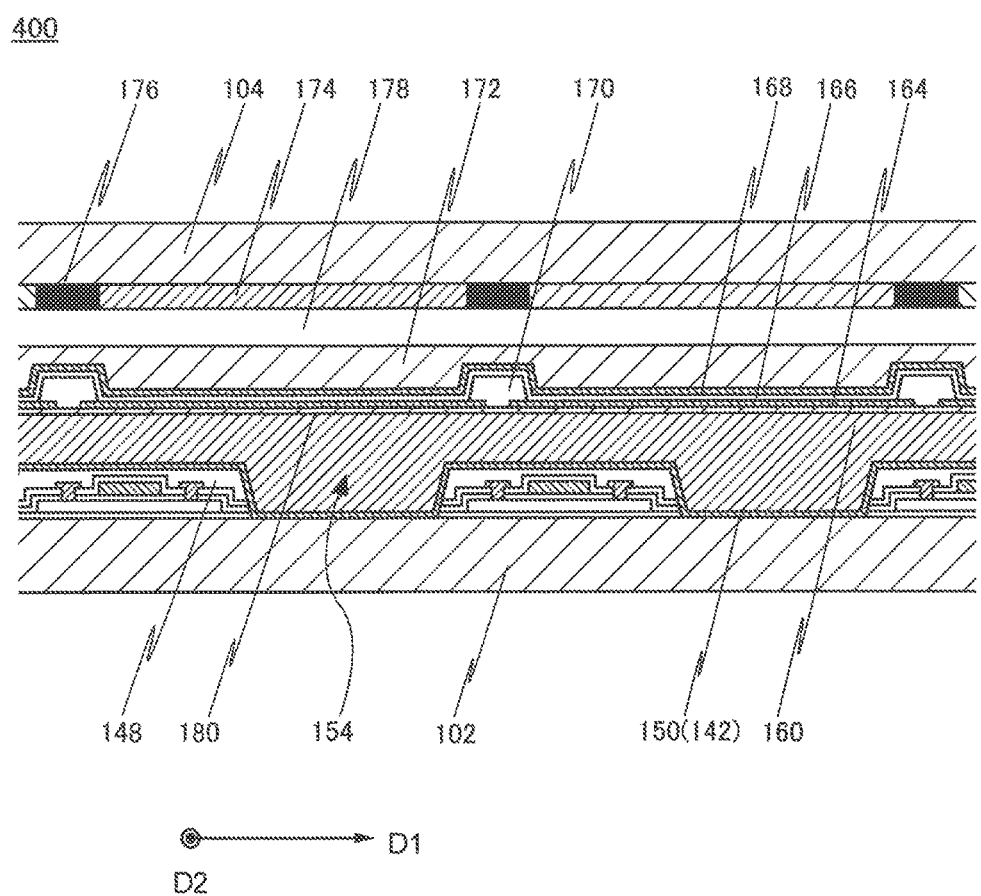
FIG. 6 is a cross-sectional diagram for explaining a structure of a display device related to one embodiment of the present invention.

The structure of a display device 400 related to the present embodiment is explained in detail while referring to FIG. 6. FIG. 6 is a cross-sectional diagram showing a structure of a display device 400 related to the present embodiment.

When the display device 400 related to the present embodiment is compared with the display device 300 related to the third embodiment, the display device 400 related to the present embodiment is different in that a plurality of first groups of the wiring 150 is arranged along the transistor layer 148 including a plurality of aperture parts 154 and directly arranged on the top of the transistor layer 148. That is, a plurality of first groups of wiring 150 is arranged along a peak part, side wall and bottom surface of the transistor layer 148.

By adopting such a structure, it is possible to form the reliefs of the first group of wiring 150 using the concave-convex shape of the transistor layer 148. Therefore, it is possible to simplify the manufacturing process and reduce manufacturing costs.

Fifth Embodiment

Figure 7:
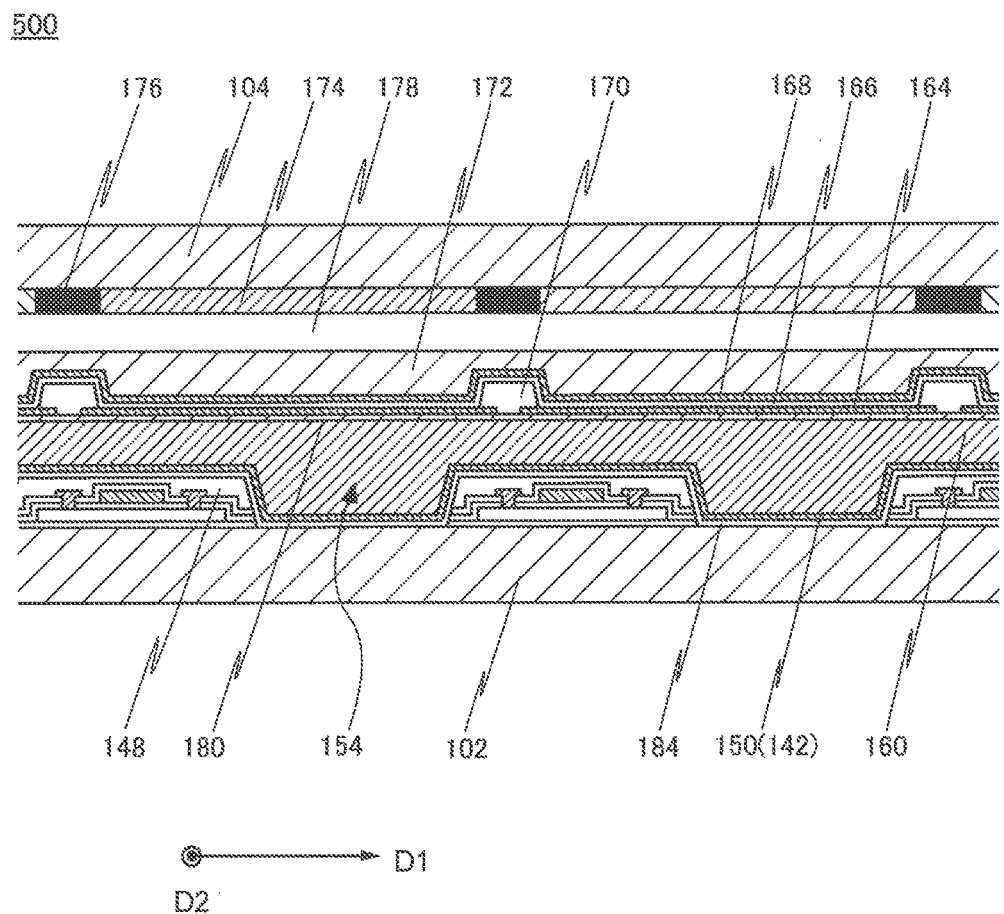
FIG. 7 is a cross-sectional diagram for explaining a structure of a display device related to one embodiment of the present invention.

The structure of a display device 500 related to the present embodiment is explained in detail while referring to FIG. 7. FIG. 7 is a cross-sectional diagram showing a structure of a display device 500 related to the present embodiment.

When the display device 500 related to the present embodiment is compared with the display device 400 related to the fourth embodiment, the display device 500 related to the present embodiment is further arranged with a cover layer 184 which covers the transistor layer 148 and is arranged between the transistor layer 148 and the plurality of first groups of wiring 150. That is, a plurality of first groups of the wiring 150 is arranged along a peak part, side wall and bottom surface of the transistor layer 148.

The cover layer 148 includes an inorganic insulation layer. It is possible to use a film of silicon oxide (SiOx), silicon nitride (SiNx), silicon nitrided oxide (SiOxNy), silicon oxynitride (SiNxOy), aluminum oxide (AlOx), aluminum nitride (AlNx), aluminum nitrided oxide (AlOxNy), and aluminum oxynitride (AlNxOy) and the like (x and y are arbitrary) as the material of the inorganic insulation layer. In addition, a structure in which these films are stacked may also be used.

By adopting such a structure, it is possible to protect a plurality of sectioned transistors. Therefore, it is possible to provide a display device with improved reliability.

Sixth Embodiment

Figure 8:
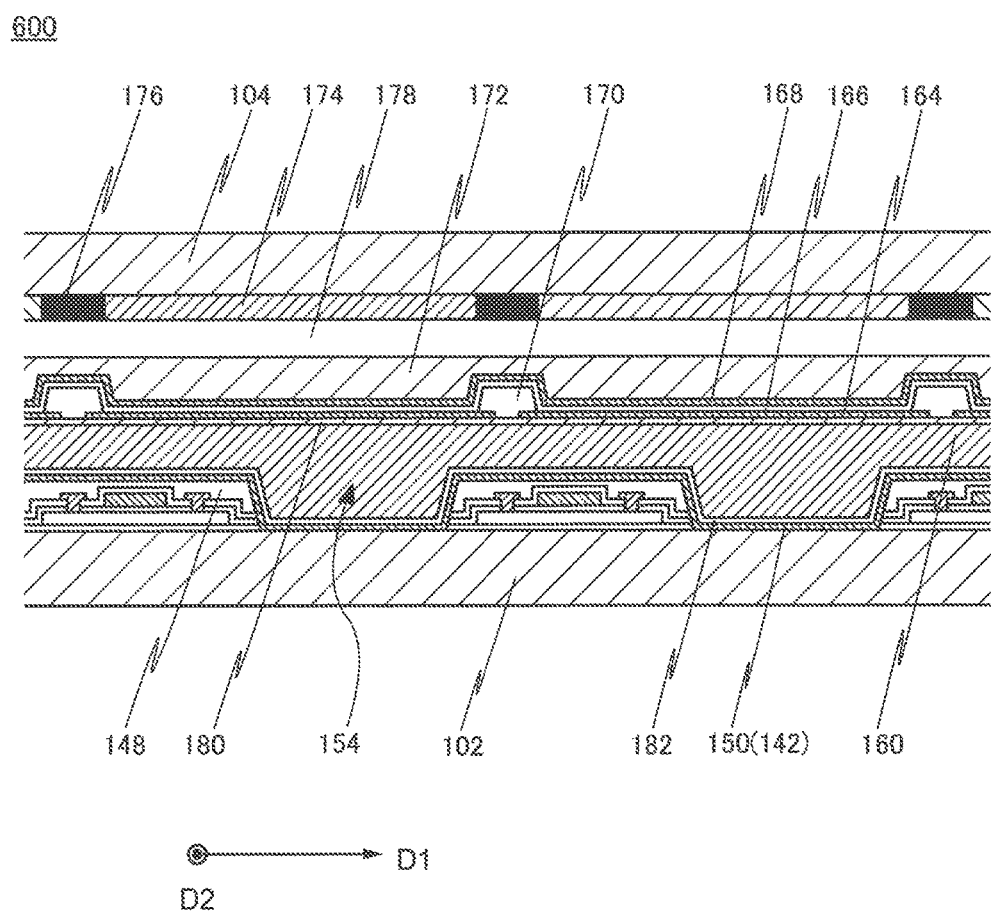
FIG. 8 is a cross-sectional diagram for explaining a structure of a display device related to one embodiment of the present invention.

The structure of a display device 600 related to the present embodiment is explained in detail while referring to FIG. 8. FIG. 8 is a cross-sectional diagram showing a structure of a display device 600 related to the present embodiment.

When the display device 600 related to the present embodiment is compared with the display device 500 related to the fifth embodiment, the display device 600 related to the present embodiment is further arranged with a cover layer 182 which covers the transistor layer 148 and is arranged above the plurality of first groups of wiring 150. That is, a layer in the display device 600 related to the present embodiment in which the plurality of first groups of wiring 150 and cover layer 184 are arranged is the reverse of the layer in the display device 500 related to the fifth embodiment.

By adopting such a structure, it is possible to protect a plurality of sectioned transistors and the first group of wiring 150. Therefore, it is possible to provide a display device with improved reliability.

Seventh Embodiment

Figure 9:
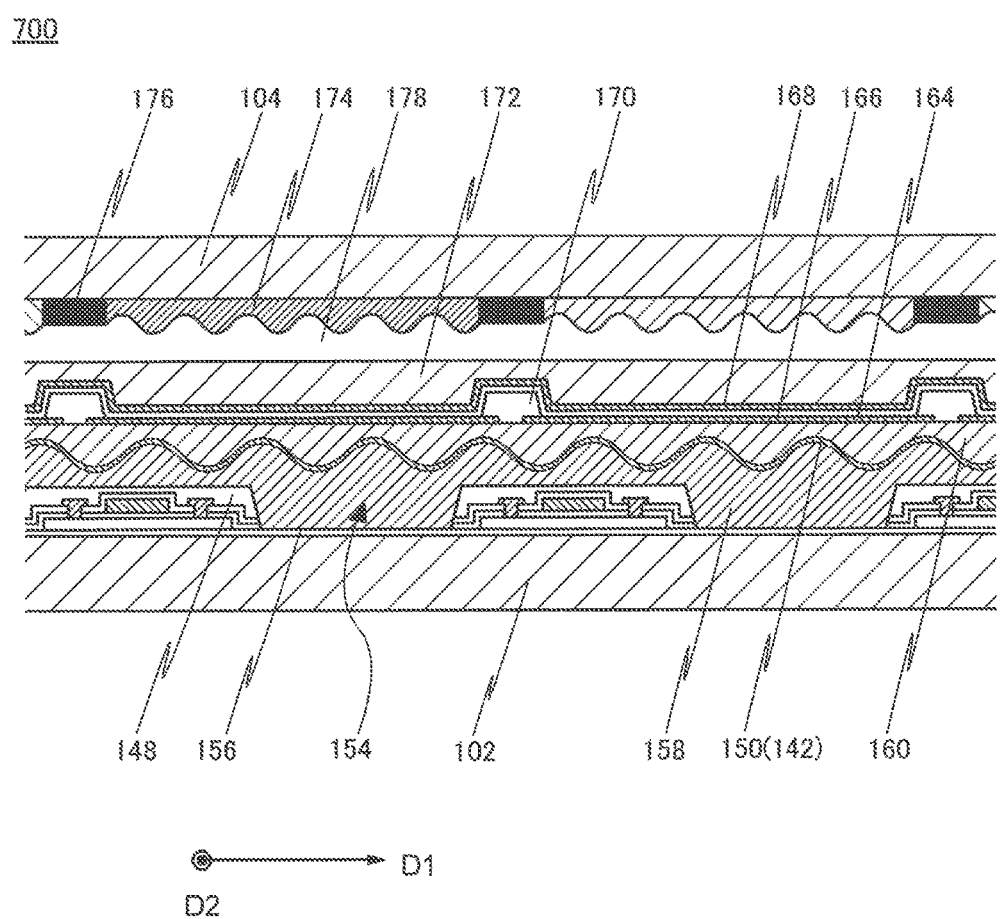
FIG. 9 is a cross-sectional diagram for explaining a structure of a display device related to one embodiment of the present invention.

The structure of a display device 700 related to the present embodiment is explained in detail while referring to FIG. 9. FIG. 9 is a cross-sectional diagram showing a structure of a display device 700 related to the present embodiment.

When the display device 700 related to the present embodiment is compared with the display device 100 related to the first embodiment, the display device 700 related to the present embodiment is different in that a plurality of color filters 174 having a concave-convex pattern on a surface thereof is arranged on a surface of the second substrate 104 opposing the first substrate 102.

By adopting such a structure, it is possible to further relieve stress when the display device 700 is bent. Therefore, it is possible to provide a display device 700 with improved reliability.

Eighth Embodiment

Figure 10:
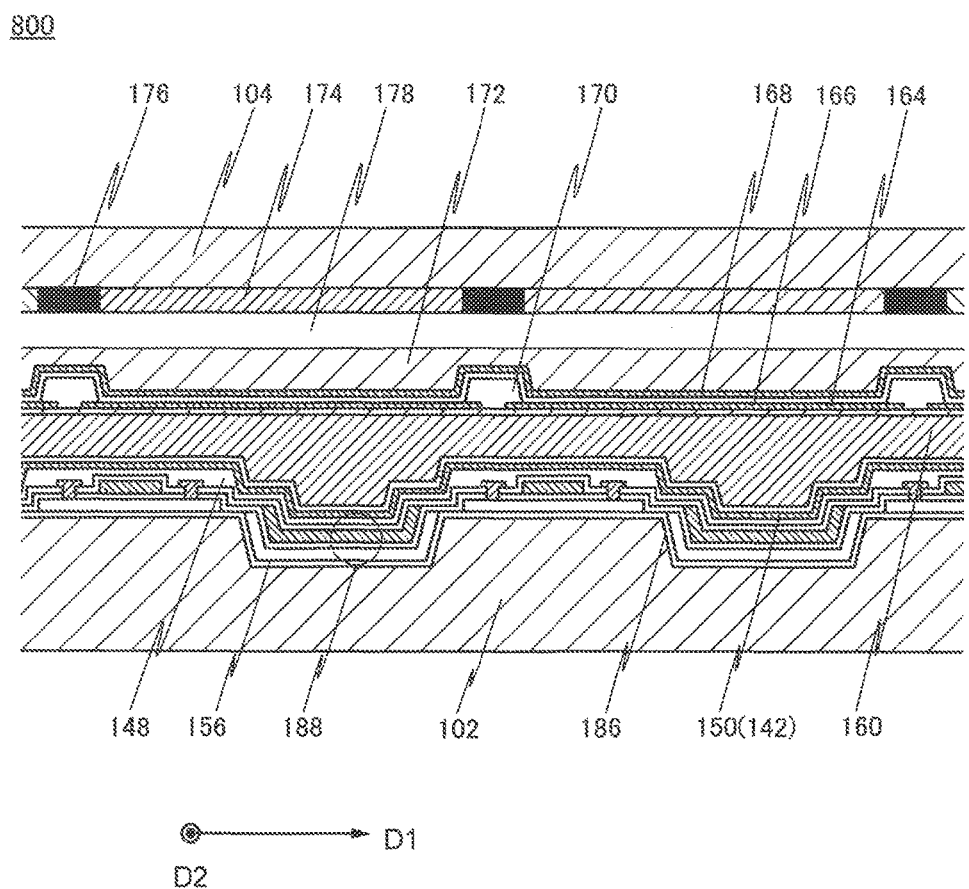
FIG. 10 is a cross-sectional diagram for explaining a structure of a display device related to one embodiment of the present invention.

The structure of a display device 800 related to the present embodiment is explained in detail while referring to FIG. 10. FIG. 10 is a cross-sectional diagram showing a structure of a display device 800 related to the present embodiment.

When the display device 800 related to the present embodiment is compared with the display device 100 related to the first embodiment, the display device 800 related to the present embodiment is different in that the first substrate 102 has a plurality of concave parts 186 which extend in a second direction D2 and which separate two transistors adjacent in a first direction D1.

By adopting such a structure, it is possible to widen the area of the first group of wiring 150. Therefore, heat dissipation and soaking effects of the first group of wiring 150 are improved. Therefore, it is possible to provide a high performance display device.

A plurality of capacitors 188 may be further arranged in the plurality of concave parts 186.

By adopting such a structure, since it is possible to use a side wall of a concave part 186 as a part of a capacitor 188, it is possible to increase the capacitance which can be formed in each of the plurality of pixels 108. Therefore, it is possible to provide a high performance display device. Furthermore, although kind of the capacitor 188 is not limited, in the present embodiment, the capacitor 188 is a storage capacitor 126.

Ninth Embodiment

Figure 11:
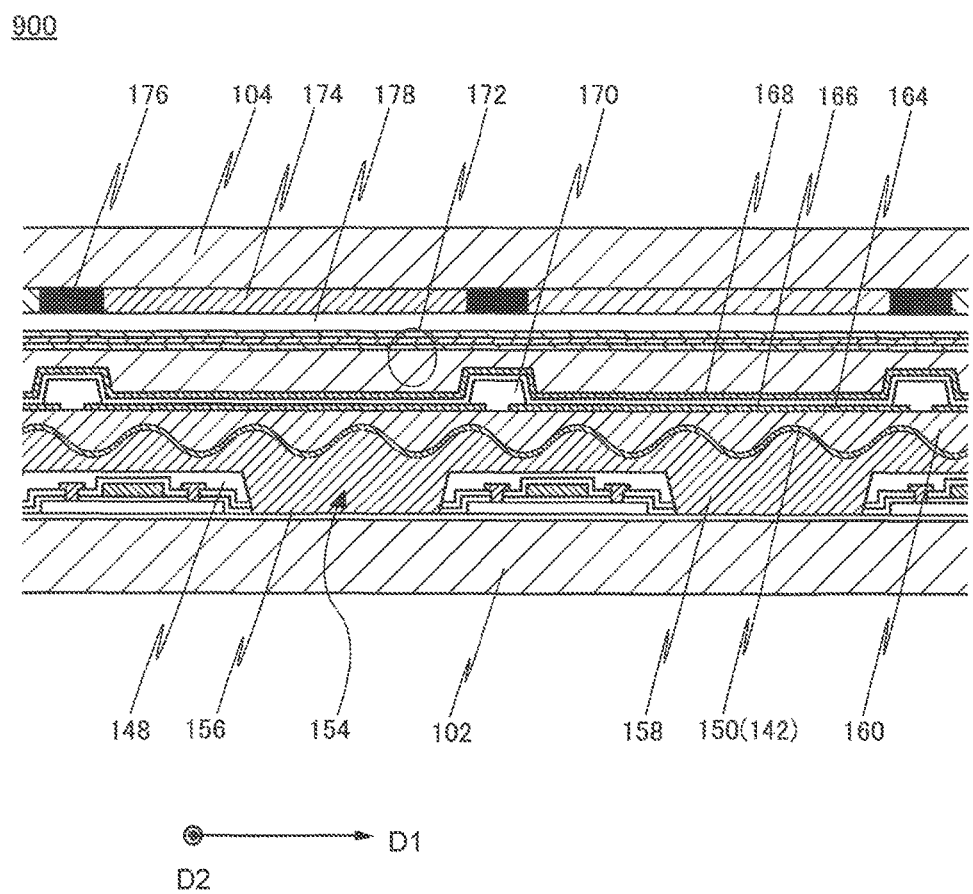
FIG. 11 is a cross-sectional diagram for explaining a structure of a display device related to one embodiment of the present invention.

The structure of a display device 900 related to the present embodiment is explained in detail while referring to FIG. 11. FIG. 11 is a cross-sectional diagram showing a structure of a display device 900 related to the present embodiment.

When the display device 900 related to the present embodiment is compared with the display device 100 related to the first embodiment, the display device 900 related to the present embodiment is further arranged with a sealing layer 172 alternately stacked with an organic insulation layer and an inorganic insulation layer and which covers the plurality of pixels 108.

By adopting such a structure, it is possible to suppress the infiltration of moisture from the second substrate 104. Therefore, it is possible to provide a display device with improved reliability.

Furthermore, in this example, although the sealing layer 172 includes a stacked layer structure of four layers, there is no limitation to the number of stacked layers.

Tenth Embodiment

Figure 12:
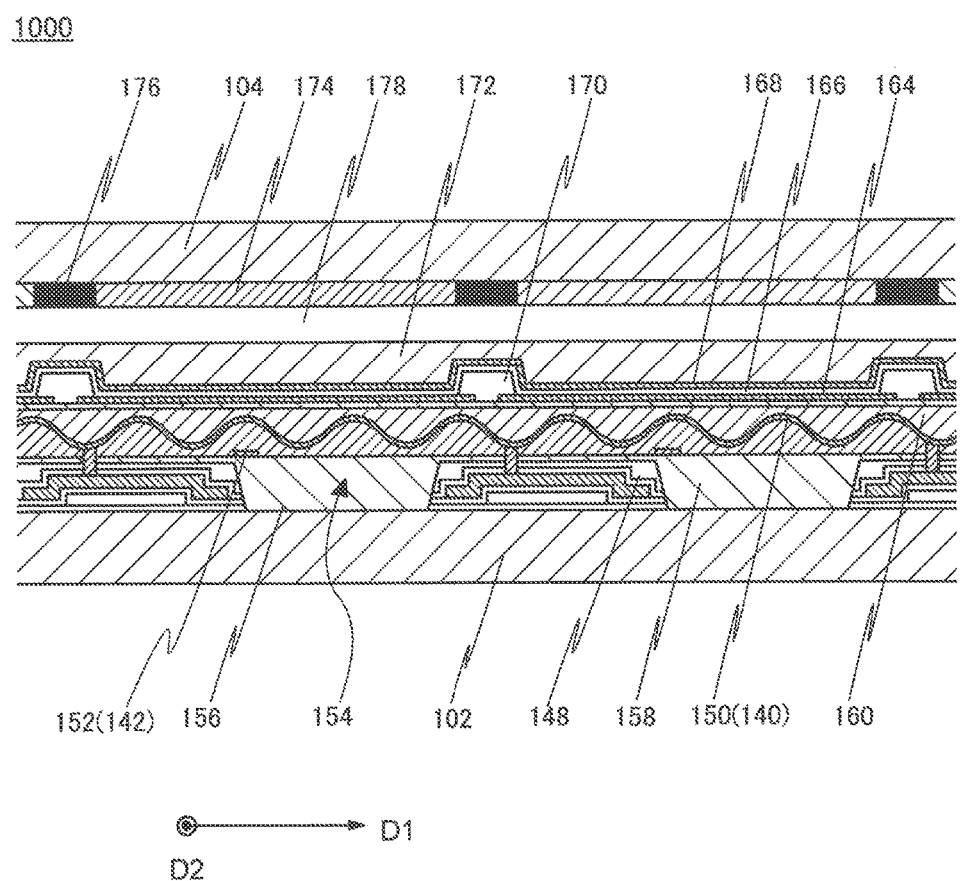
FIG. 12 is a cross-sectional diagram for explaining a structure of a display device related to one embodiment of the present invention.

The structure of a display device 1000 related to the present embodiment is explained in detail while referring to FIG. 12. FIG. 12 is a cross-sectional diagram showing a structure of a display device 1000 related to the present embodiment.

When the display device 1000 related to the present embodiment is compared with the display device 100 related to the first embodiment, the display device 1000 related to the present embodiment is different in that the first group of wiring 150 includes a scanning signal line 140 and the second group of wiring 152 includes a video signal line 142. That is, at this time, the first direction D1 indicates a direction which a scanning signal line 140 extends, and the second direction D2 indicates a direction in which a video signal line 142 extends. That is, in the display device 1000 related to the present embodiment, the direction D1 and direction D2 are interchanged in the circuit diagram of FIG. 2.

By adopting such a structure, cracks in an inorganic insulation layer or wire breakage hardly occurs when bending along a direction perpendicular to a scanning signal line 140. Therefore, it is possible to provide a display device 1000 with improved reliability.

Eleventh Embodiment

Figure 13:
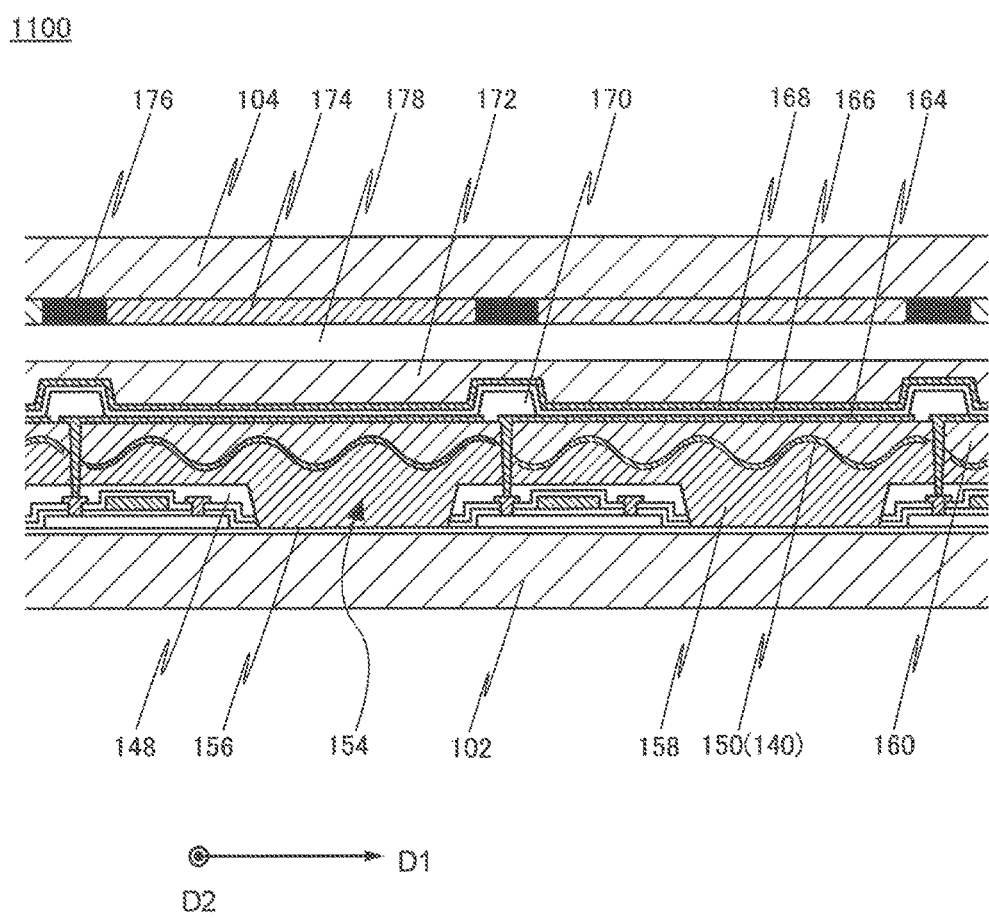
FIG. 13 is a cross-sectional diagram for explaining a structure of a display device related to one embodiment of the present invention.

The structure of a display device 1100 related to the present embodiment is explained in detail while referring to FIG. 13. FIG. 13 is a cross-sectional diagram showing a structure of a display device 1100 related to the present embodiment.

When the display device 1100 related to the present embodiment is compared with the display device 100 related to the first embodiment, the display device 1100 related to the present embodiment is different in that a drain electrode and pixel electrode 164 of a transistor are connected via a contact hole, and the first group of wiring 150 is arranged to avoid the contact hole. Here, a transistor in the diagram serves as a drive transistor 124. The first group of wiring 150 may also include a video signal line 142 and power supply voltage line 144.

Twelfth Embodiment

Figure 14A:
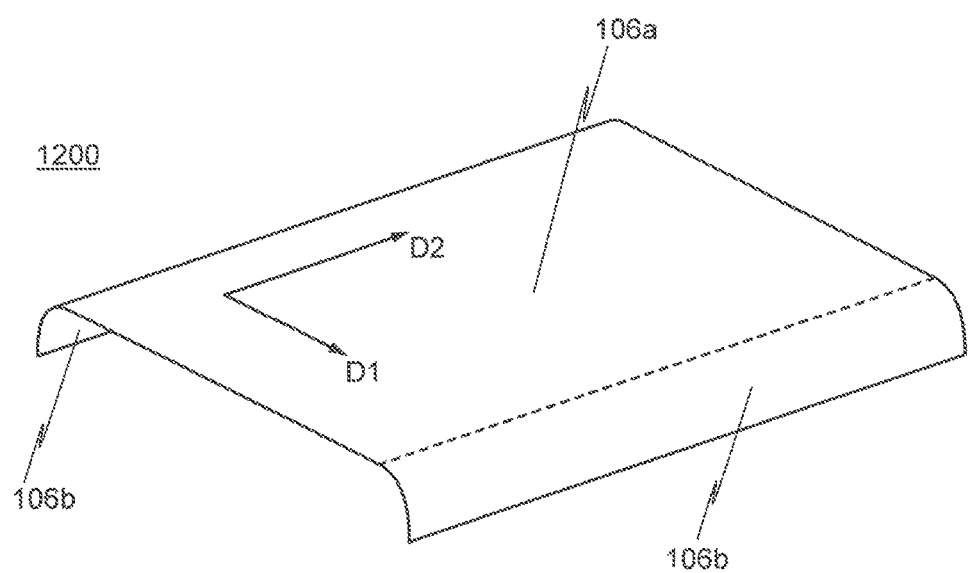
FIG. 14A is a perspective view diagram for explaining a structure of a display device related to one embodiment of the present invention.

The structure of a display device 1200 related to the present embodiment is explained in detail while referring to FIG. 14A. FIG. 14A is a perspective view diagram showing a schematic structure of a display device 1200 related to the present embodiment.

The display device 1200 related to the present embodiment includes a planar region 106a and a bending region 106b in a display region 106. In this example, the bending region 106b is arranged along two opposing sides of a rectangular shaped display region 106.

A wire structure of a conventional display device may be included in the planar region 106, and the wire structures of the display devices related to the first to tenth embodiments described previously may be included in the bending region 106b. That is, a first group of wiring is arranged to extend in a direction D1. A shape is obtained whereby the bending region 106b bends in the direction D1 and essentially does not bend in the direction D2. Therefore, the amount which a bending region can be bent in the direction D1 is larger than the amount which a bending region can be bent in the direction D2.

Here, a first group of wiring may include a video signal line. In this case, a second group of wiring which extends in a second direction includes a scanning signal line.

In addition, a first group of wiring may include a scanning signal line. In this case, a second group of wiring which extends in a second direction includes a video signal line.

By adopting such a structure, it is possible to provide a display device 1200 which easily bends in the vicinity of two opposing sides of a display region 106.

Modified Example

Figure 14B:
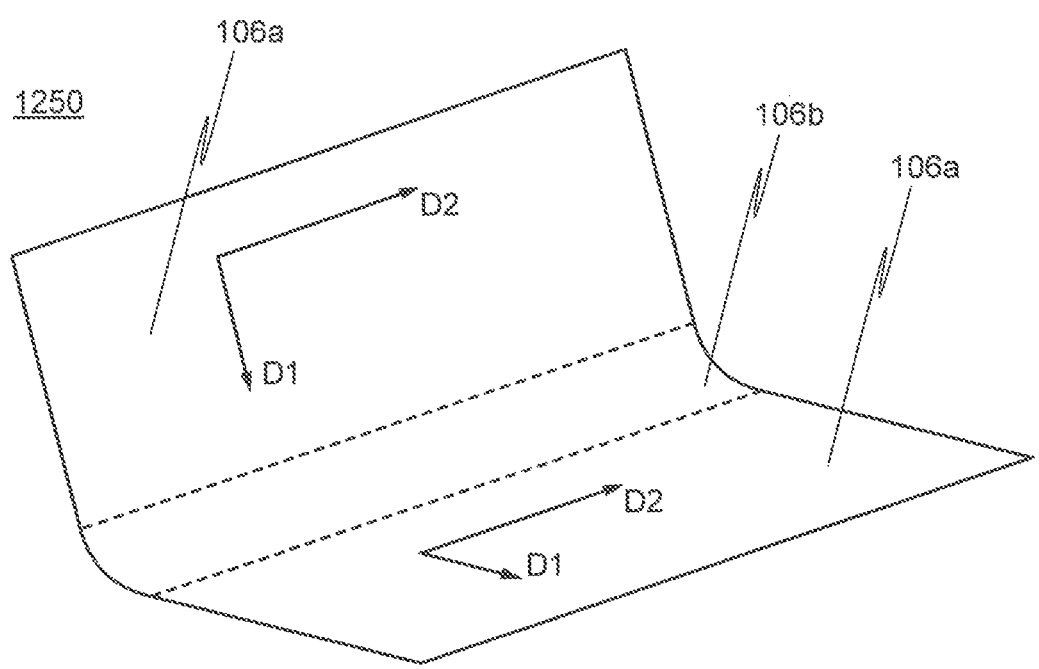
FIG. 14B is a perspective view diagram for explaining a structure of a display device related to one embodiment of the present invention.

FIG. 14B is a perspective view diagram showing a schematic structure of a display device 1250 related to a modified example of the present embodiment.

The display device 1250 related to the present example is arranged with a planar region 106a along two opposing sides of a rectangular display region 106 the reverse of the display device 1200. The bending region 106b is arranged so as to be sandwiched by two planar regions 106a. A shape is obtained whereby the bending region 106b is bent in the direction D1 and is not bent in the direction D2. Therefore, the amount which a bending region can be bent in the direction D1 is larger than the amount which a bending region can be bent in the direction D2.

By adopting such a structure, it is possible to provide a display device 1250 which is easily bent along a line which divides a display region 106 in two.

The display devices 100 to 1250 related to the preferred embodiments of the present invention were explained above. However, these embodiments are merely examples and the technical scope of the present invention is not limited to these embodiments. A person ordinarily skilled in the art could make various modifications without departing from the concept of the present invention claimed in the scope of the patent claims. Therefore, such modifications should also be interpreted as belonging to the technical scope of the present invention.

What is claimed is:
1. A display device comprising:
    a first substrate having flexibility and including a plurality of pixels arranged in a matrix form in a first direction and a second direction, the first direction and second direction mutually intersecting each other;
    a transistor layer which is arranged above the first substrate, includes at least one transistor arranged in each of the plurality of pixels, and has an inorganic insulation layer formed in the plurality of pixels in common and a plurality of aperture parts that pass through the inorganic insulation layer, extend in the second direction, and are arranged between two transistors arranged in two of the plurality of pixels adjacent in the first direction;

a plurality of first groups of wirings extending continuously in the first direction and connected to each of a plurality of pixels arranged in the first direction among the plurality of pixels;

a plurality of second groups of wirings extending in the second direction and connected to each of a plurality of pixels arranged in the second direction among the plurality of pixels;

a first organic insulation layer on the transistor layer; and a second organic insulation layer on the first organic insulation layer, wherein the first groups of wirings are arranged between the first and the second organic insulation layers, and a shape of each of the first groups of wirings is a corrugated form with curves that repeat in the first direction that is perpendicular to the second direction in a cross-sectional view.

2. The display device according to claim 1, wherein the plurality of first groups of wirings include a video signal line and the plurality of second groups of wirings include a scanning signal line.

3. The display device according to claim 1, wherein the plurality of first groups of wirings include a scanning signal line and the plurality of second groups of wirings include a video signal line.

4. The display device according to claim 1, further comprising:

an underlying layer arranged between the first substrate and the transistor layer;

wherein each of the plurality of aperture parts sections the underlying layer in at least the first direction; and the underlying layer is formed in the plurality of pixels in common in the second direction.

5. The display device according to claim 4, further comprising:

a planarizing insulation layer arranged above the plurality of first groups of wirings; and a light-emission element arranged in each of the plurality of pixels above the planarizing insulation layer.

6. The display device according to claim 5, further comprising:

an inorganic insulation layer arranged between the planarizing insulation layer and the light-emission element.

7. The display device according to claim 1, wherein the plurality of first groups of wirings are arranged along a surface of a transistor layer including the plurality of aperture parts.

8. The display device according to claim 7, further comprising:

a cover layer covering the transistor layer, including an inorganic insulation layer, and arranged between the transistor layer and the plurality of first groups of wiring.

9. The display device according to claim 7, further comprising:

a cover layer covering the transistor layer, including an inorganic insulation layer, and arranged above the plurality of first groups of wiring.

10. The display device according to claim 1, further comprising:

a concave-convex layer covering the transistor layer, arranged below the plurality of first groups of wirings, and having a surface with a concave-convex shape.

11. The display device according to claim 10, wherein the plurality of first groups of wirings are formed along a surface of the concave-convex layer.

12. The display device according to claim 1, further comprising:

a sealing layer covering the plurality of pixels and including an inorganic insulation layer.

13. The display device according to claim 12, further comprising:

a sealing layer including an organic insulation layer.

14. The display device according to claim 13, further comprising:

a sealing layer alternately stacked with the organic insulation layer and the inorganic insulation layer.

15. The display device according to claim 1, wherein the plurality of first groups of wirings are larger than the plurality of second groups of wirings with respect to a relief in a thickness direction of the first substrate.

16. The display device according to claim 1, wherein a planar region and a bending region each including a display region, the bending region capable of being bent more in the first direction than in the second direction.

17. The display device according to claim 1, further comprising:

a second substrate having flexibility and arranged opposing the first substrate; and a plurality of color filters having a surface with a concave-convex pattern and arranged in a surface where the second substrate opposes the first substrate.

18. The display device according to claim 1, wherein the first substrate includes a plurality of concave parts extending in the second direction, the plurality of concave parts separating adjacent the two transistors in the first direction.

19. The display device according to claim 18, further comprising: a plurality of capacitors arranged in the plurality of concave parts.

20. The display device according to claim 19, wherein the plurality of capacitors is arranged across a bottom part and a part of a side wall of the plurality of concave parts.

* * * * *